US012718903B2

(12) United States Patent
Won et al.

(10) Patent No.: US 12,718,903 B2
(45) Date of Patent: Aug. 25, 2026

(54) STORAGE DEVICE AND METHOD OF APPLYING DYNAMIC PARITY

(71) Applicant: SAMSUNG ELECTRONICS CO., LTD., Suwon-si (KR)

(72) Inventors: Seona Won, Suwon-si (KR); Gibeom Park, Suwon-si (KR); Sung-Hwan Bae, Suwon-si (KR); Dong-Min Shin, Suwon-si (KR); Kangseok Lee, Suwon-si (KR); Jinwoo Hong, Suwon-si (KR); Youngjun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 92 days.

(21) Appl. No.: 18/737,514

(22) Filed: Jun. 7, 2024

(65) Prior Publication Data

US 2025/0201333 A1 Jun. 19, 2025

(30) Foreign Application Priority Data

Dec. 14, 2023 (KR) ........................ 10-2023-0182163

(51) Int. Cl.
*G11C 29/52* (2006.01)
*G11C 16/10* (2006.01)
*G11C 16/34* (2006.01)

(52) U.S. Cl.
CPC ............ *G11C 29/52* (2013.01); *G11C 16/102* (2013.01); *G11C 16/349* (2013.01)

(58) Field of Classification Search
CPC ..... G11C 29/52; G11C 16/102; G11C 16/349; G11C 29/42; G11C 16/08; G11C 16/0483; G11C 2029/0411; G06F 3/0619; G06F 3/0604; G06F 3/0658; G06F 11/10; G06F 2212/403
USPC ..................................................... 365/185.09
See application file for complete search history.

(56) References Cited

U.S. PATENT DOCUMENTS 5,448,578 A * 9/1995 Kim .................... G06F 11/1076 714/766
8,634,243 B2 1/2014 Lin
10,489,246 B2 11/2019 Ou et al.
10,929,224 B2 2/2021 Klein et al.
11,276,445 B2 3/2022 Kim et al.
11,334,254 B2 5/2022 Kannan
11,508,454 B2 11/2022 Moon et al.
2011/0280074 A1 11/2011 Lin
2019/0073264 A1 3/2019 Ou et al.
2020/0342925 A1 10/2020 Kim et al.
2020/0401477 A1 12/2020 Klein et al.
2021/0327529 A1 10/2021 Moon et al.
2023/0052161 A1* 2/2023 Seok .................. G11C 11/5642
2023/0195567 A1 6/2023 Bueb et al.

* cited by examiner

*Primary Examiner* — Huan Hoang
(74) *Attorney, Agent, or Firm* — Sughrue Mion, PLLC

(57) ABSTRACT

In a storage device, an ECC engine performs first ECC encoding on first data to be programmed to a first wordline to generate a first parity, and performs second ECC encoding on second data to be programmed to a second wordline to generate a second parity. A page buffer stores the first data together with a first part of the first parity to be programmed to the first wordline, and stores the second data, a second part of the first parity, and the second parity to be programmed to the second wordline.

20 Claims, 10 Drawing Sheets

STORAGE DEVICE AND METHOD OF APPLYING DYNAMIC PARITY

CROSS-REFERENCE TO RELATED APPLICATION

This application is based on and claims priority under 35 U.S.C. § 119 to Korean Patent Application No. 10-2023-0182163 filed on Dec. 14, 2023 in the Korean Intellectual Property Office, the disclosure of which is incorporated by reference herein in its entirety.

BACKGROUND

1. Field

The disclosure is directed to a storage device and a method of applying dynamic parity.

2. Description of Related Art

Storage devices are designed to increase capacity. To increase capacity, many wordlines are used. Due to process variations, some of the wordlines may be weak and data stored on the weak wordlines may be lost.

SUMMARY

One or more embodiments may provide a storage device and a method of applying a dynamic parity for protecting weak wordlines.

According to one or more embodiments, a storage device may include a memory cell array including a plurality of wordlines, an error correction code (ECC) engine, and a page buffer. The ECC engine may be configured to perform first ECC encoding on first data to be programmed to a first wordline among the plurality of wordlines to generate a first parity, and perform a second ECC encoding on second data to be programmed to a second wordline among the plurality of wordlines to generate a second parity. The page buffer may be configured to store the first data and a first part of the first parity to be programmed to the first wordline, and store the second data, a second part of the first parity, and the second parity to be programmed to the second wordline.

According to one or more embodiments, a storage device may include a non-volatile memory device including a memory cell array including a plurality of wordlines, and an ECC engine. The ECC engine may be configured to perform first ECC encoding on first data to be programmed to a first wordline among the plurality of wordlines to generate a first parity, and perform second ECC encoding on second data to be programmed to a second wordline paired with the first wordline among the plurality of wordlines to generate a second parity, the second ECC encoding having a lower parity generation rate than the first ECC encoding.

According to one or more embodiments, a method of applying dynamic parity in a storage device may include performing first ECC encoding on first data to generate a first parity, programming a first part of the first data and the first parity into a first wordline, performing second ECC encoding on second data to generate a second parity, the second ECC encoding having a lower parity generation rate than the first ECC encoding, and programming the second data, the second parity, and a second part of the first parity to a second wordline paired with the first wordline.

DETAILED DESCRIPTION OF EMBODIMENTS

Figure 1:
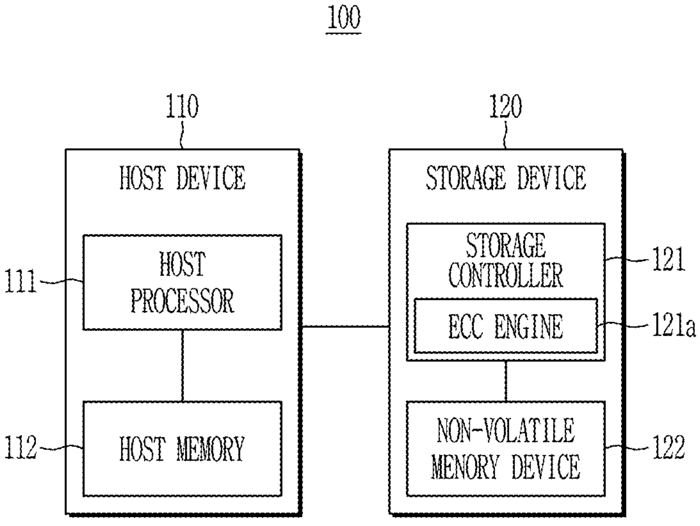
FIG. 1 is a block diagram illustrating an example of a computing system according to one or more embodiments.

In the following detailed description, only certain embodiments of the disclosure have been shown and described, simply by way of illustration. These embodiments are example embodiments. As those skilled in the art would realize, the described embodiments may be modified in various different ways, all without departing from the spirit or scope of the disclosure.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

FIG. 1 is a block diagram illustrating an example of a computing system according to one or more embodiments.

Referring to FIG. 1, a computing system 100 may include a host device 110 and a storage device 120.

The host device 110 may control an overall operation of the computing system 100, and may include a host processor 111 and a host memory 112. The host processor 111 may control an overall operation of the host device 110. The host processor 111 may be implemented as at least one of various processors such as a central processing unit (CPU) and an application processor (AP). The host memory 112 may store various data and instructions. The host memory 112 may store data to be transferred to the storage device 120 or data transferred from the storage device 120. The host memory 112 may be, for example, a dynamic random-access memory (DRAM).

The storage device 120 may be used as a storage medium for the computing system 100. In one or more embodiments, the storage device 120 may be removably connected to the host device 110. In some other embodiments, the storage device 120 may be integrated within the host device 110 or non-removably connected to the host device 110. In one or more embodiments, the host device 110 may access the storage device 120 based on a storage protocol. The storage protocol may be, for example, a non-volatile memory express (NVMe) protocol.

The storage device 120 may include a storage controller 121 and a non-volatile memory device 122. The storage controller 121 may provide a signal to the non-volatile memory device 122 in response to a request from the host device 110 to control a memory operation of the non-volatile memory 120. In one or more embodiments, the storage controller 121 may generate a request based on an application executed by the storage controller 121 and provide a signal to non-volatile memory device 122 in response to the request to control a memory operation of the non-volatile memory device 122. The signal may include a command and/or data. The command may include a command such as a read command (request) or a write (program) command (request), and an address. The storage controller 121 may provide a read command to the non-volatile memory device 122 to read data from the non-volatile memory device 122. The storage controller 121 may provide a write command and data to the non-volatile memory device 122 to write (program) the data to the non-volatile memory device 122. In one or more embodiments, the storage controller 121 may provide an erase command to the non-volatile memory device 122 to erase data stored in the non-volatile memory device 122.

The non-volatile memory device 122 may be a storage medium of the storage device 120. In one or more embodiments, the non-volatile memory device 122 may include one or more memory packages. The memory package may include, for example, a memory chip or a memory die. In one or more embodiments, the non-volatile memory device 122 may be a memory device based on a NAND flash memory. When the non-volatile memory device 122 is the memory device based on the NAND flash memory, the storage device 120 may be, for example, a solid-state drive (SSD) or an embedded multimedia card (eMMC). In some other embodiments, the non-volatile memory device 122 may be a memory device based on other non-volatile memory. The other non-volatile memory may be, for example, a phase-change memory, a resistive memory, a magnetoresistive memory, a ferroelectric memory, or a polymer memory.

The non-volatile memory device 122, for example, a memory package, may include a memory cell array. The memory cell array may be divided into a plurality of blocks. The memory cell array may include a plurality of wordlines. Each wordline may be connected to a plurality of memory cells. Each memory cell may be, for example, a NAND memory cell. In one or more embodiments, a predetermined number of memory cells connected to a wordline may form at least one page, and a plurality of pages may form a block.

The storage controller 121 may include an error correction code (ECC) engine 121*a*. In a program operation of programming target data to a target page formed by a target wordline of the plurality of wordlines, the ECC engine 121*a* may perform ECC encoding on the target data to generate a parity. Thus, encoded data that the ECC engine 121*a* generates by performing the ECC encoding may include the target data and the parity. The encoded data may be stored in a page buffer corresponding to the target page of the non-volatile memory device 122, and the encoded data stored in the page buffer may be programmed to the target wordline. Among the plurality of memory cells connected to each wordline, some memory cells may be used as a data region to store data, and remaining memory cells may be used as a parity region to store the parity for the corresponding wordline.

The ECC engine 121*a* may dynamically use the ECC encoding based on a health state of the wordline. As the ECC encoding is dynamically used, a size of a parity generated by the ECC encoding may vary. The size of the parity may be the number of parity bits generated by the ECC encoding. If the size of the parity generated from the data for the target wordline is great, the storage controller 121 may store a part of that parity in a parity region on another wordline.

Figure 2:
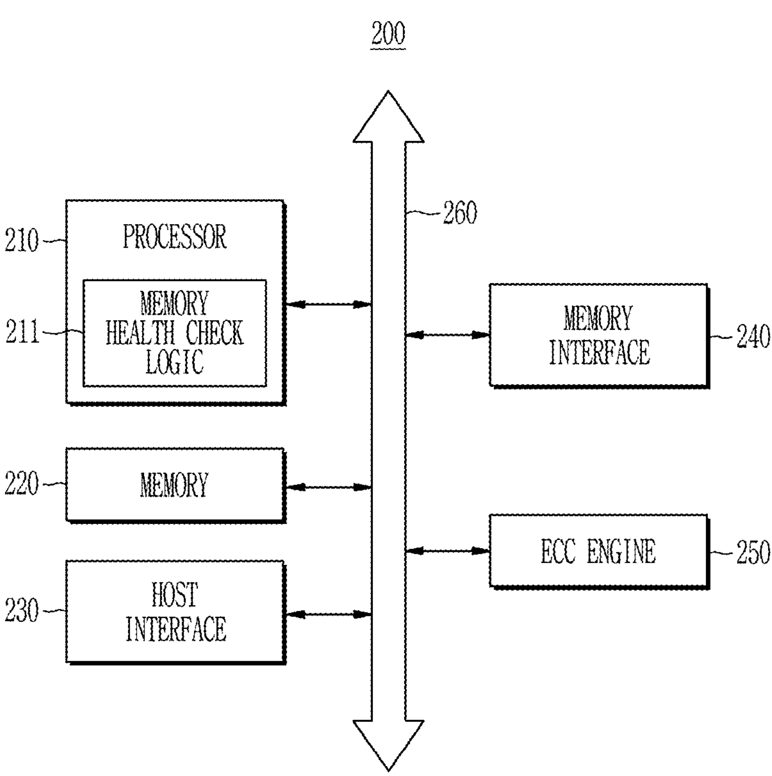
FIG. 2 is a block diagram illustrating an example of a storage controller in a storage device according to one or more embodiments.
Figure 3:
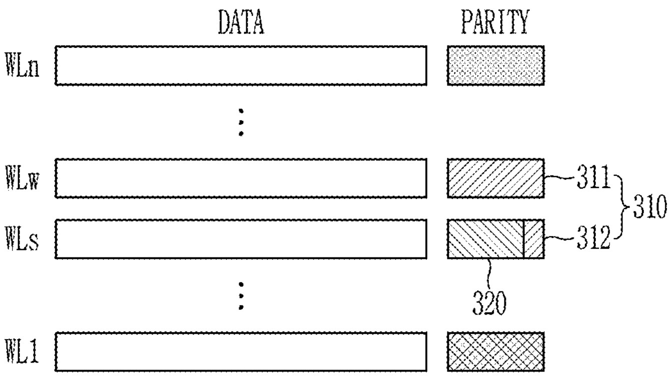
FIG. 3 is a diagram illustrating an example of a method of applying a dynamic parity in a storage device according to one or more embodiments.
Figure 4:
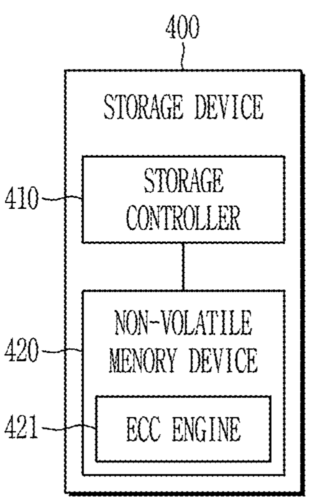
FIG. 4 is a block diagram illustrating an example of a computing system according to one or more embodiments.

FIG. 2 is a block diagram illustrating an example of a storage controller in a storage device according to one or more embodiments, FIG. 3 is a diagram illustrating an example of a method of applying a dynamic parity in a storage device according to one or more embodiments, and FIG. 4 is a block diagram illustrating an example of a computing system according to one or more embodiments.

Referring to FIG. 2, a storage controller 200, which may be or correspond to the storage controller 121 of FIG. 1, may include a processor 210, a memory 220, a host interface 230, a memory interface 240, and an ECC engine 250, which are connected via a bus 260. In one or more embodiments, the ECC engine 250 may be provided as a separate circuit (e.g., an application specific integrated circuit (ASIC)), as shown in FIG. 2, configured to perform the functions or operation described herein. Alternatively or additionally, the ECC engine 250 may be a software module, application or firmware including a computer program, codes, instructions or a combination thereof stored in or loaded into the memory 220 and implemented by the processor 210 to perform the functions or operation described herein.

The processor 210 may control an overall operation of the storage controller 200. The processor 210 may control the memory 220, the host interface 230, the memory interface 240, and the ECC engine 250. The processor 210 may include one or more cores (e.g., homogeneous multi-core or heterogeneous multi-core). The processor 210 may execute various applications (e.g., flash translation layer (FTL), firmware, etc.) loaded into the memory 220.

The memory 220 may store the various applications to be executed by the processor 210. In one or more embodiments, the memory 220 may be an on-chip memory. In one or more embodiments, the memory 220 may operate as a cache memory adjacent to the processor 210. The memory 220 may store commands, addresses, and data to be processed by the processor 210, or may store results of processing by the processor 210. The memory 220 may be a storage medium or working memory including, for example, a static random-access memory (SRAM), a dynamic random-access memory (DRAM), a thyristor random-access memory (TRAM), a tightly coupled memory (TCM), a latch, and/or a register.

The storage controller 200 may be connected to the host device 110 via a host interface 230. For example, the host interface 230 may include at least one of various interfaces including peripheral component interconnection (PCI), PCI express (PCIe), universal serial bus (USB), multimedia card (MMC), advanced technology attachment (ATA), serial- ATA, parallel-ATA, small computer small interface (SCSI), enhanced small disk interface (ESDI), integrated drive electronics (IDE), mobile industry processor interface (MIPI), and universal flash storage interface (UFS).

The storage controller 200 may be connected to a non-volatile memory device (e.g., 122 in FIG. 1) via a memory interface 240. The memory interface 240 may control data transfer between the storage controller 200 and the non-volatile memory device 122.

Memory cells may degrade due to a variety of factors. Since data may be read and programmed (or written) in pages, the degradation of memory cells may vary depending on wordlines. A wordline connected to a memory cell that is highly degraded is called a weak wordline. The weak wordline may have a less data retention ability than a normal wordline. To identify weak wordlines, the processor 210 may execute a memory health check logic 211 by executing a software module, application or firmware including a computer program, codes, instructions or a combination thereof stored in or loaded into the memory 220. In one or more embodiments, the memory health check logic 211 may be provided as a separate circuit (e.g., an ASIC).

Referring to FIG. 2 and FIG. 3, the memory health check logic 211 may check health states of a plurality of wordlines WL1 to WLn. The memory health check logic 211 may output the health state after checking the health state of each wordline. In one or more embodiments, the memory health check logic 211 may identify a weak wordline WLw among the plurality of wordlines WL1 to WLn, where w is an integer between 1 and n. In one or more embodiments, the memory health check logic 211 may output the health state of each wordline based on a program/erase (P/E) cycle count (e.g., the number of P/E cycles) and/or error bit count (e.g., the number of error bits) for each wordline. The P/E cycle may be a sequence of events in which data is programmed to the non-volatile memory device 122 and is subsequently erased. For example, the memory health check logic 211 may identify as the weak wordline a wordline WLw having the P/E cycle count exceeding a threshold (e.g., a first threshold) among the plurality of wordlines WL1 to WLn, or a wordline WLw having the error bit count exceeding a threshold (e.g., a second threshold different from the first threshold) among the plurality of wordlines WL1 to WLn. In one or more embodiments, the memory health check logic 211 may identify a wordline having a predetermined relationship with the weak wordline WLw as a strong wordline WLs paired with the weak wordline WLw, where s is an integer between 1 and N. In one or more embodiments, the memory health check logic 211 may identify a wordline WL(w−1) adjacent to the weak wordline WLw among the plurality of wordlines WL1 to WLn as the strong wordline WLs. In one or more embodiments, the wordline (e.g., WL(w−1)) to be programmed after the weak wordline WLw, of two wordlines WL(w+1) and WL(w−1) adjacent to the weak wordline WLw, may be identified as the strong wordline WLs.

In one or more embodiments, the health state of each wordline output from the memory health check logic 211 may have one of a value indicating that the wordline is a weak wordline, a value indicating that the wordline is a strong wordline, and a value indicating that the wordline is a normal wordline.

In one or more embodiments, the memory health check logic 211 may manage the health states of the plurality of wordlines WL1 to WLn as a map. In one or more embodiments, the memory health check logic 211 may store the health states of the plurality of wordlines WL1 to WLn in a storage space. In one or more embodiments, the storage space may be provided in the memory 220.

In a program operation of programming target data to a target page formed by a target wordline of the plurality of wordlines, the ECC engine 250 may perform ECC encoding on the target data to generate a parity. Thus, encoded data that the ECC engine 250 outputs by performing ECC encoding on the target data may include the target data and the parity. The encoded data may be stored in a page buffer corresponding to the target page of the non-volatile memory device 122, and the encoded data stored in the page buffer may be programmed to a target wordline. Among the plurality of memory cells connected to each wordline, some memory cells may be used as a data region to store data, and remaining memory cells may be used as a parity region to store the parity for that wordline.

The ECC engine 250 may perform ECC encoding such that a size of a parity 310 generated from data for a weak wordline WLw is greater than a size of a parity generated from data for a strong wordline. In one or more embodiments, the ECC engine 250 may perform first ECC encoding on the data for the weak wordline WLw and third ECC encoding on the data for the strong wordline. In this case, the number of parity bits generated from information bits (i.e., data bits) by the first ECC encoding may be greater than the number of parity bits generated from the information bits by the third ECC encoding. In one or more embodiments, the first ECC encoding may be ECC encoding that generates additional parity by performing ECC encoding (fourth ECC encoding) on the parity generated by typical (or default) ECC encoding (e.g., the third ECC encoding). Due to the large size of the parity 310 generated from the data for the weak wordline WLw, some of the parity 312 for the weak wordline WLw may not be stored in a parity region of the weak wordline WLw. That is, a part 311 of the parity 310 generated from the data for the weak wordline WLw may be stored in the parity region of the weak wordline WLw, and a remaining part 312 of the parity 310 may not be stored in the parity region of the weak wordline WLw. In one or more embodiments, the part 311 of the parity 310 may be a parity generated by performing the third ECC encoding on the data for the weak wordline WLw, and the remaining part 312 of the parity 310 may be a parity generated by performing the fourth ECC encoding on the parity generated by performing the third ECC encoding.

Since a wordline is connected to or corresponds to at least one page comprising a plurality of memory cells, it is to be understood herein a data region and a parity region of a wordline may indicate or correspond to a data region and a parity region of at least one page or a plurality of memory cells forming the at least one page. Further, programming data and/or a parity to a wordline may refer to programming the data and/or the parity to the at least one page.

The ECC engine 250 may perform ECC encoding such that a size of a parity 320 generated from data for a strong wordlines WLs is smaller than a size of a parity generated from data for a normal wordline. In one or more embodiments, the ECC engine 250 may perform second ECC encoding on the data for the strong wordline WLs and the third ECC encoding on the data for the normal wordline. In this case, the number of parity bits generated from information bits (i.e., data bits) by the second ECC encoding may be smaller than the number of parity bits generated from the information bits by the third ECC encoding. Because the size of the parity 320 generated from the data for the strong wordlines WLs is small, a free space may exist in the parity region of the strong wordline WLs in which the parity 320 of the strong wordline WLs is stored. Therefore, the processor 210 may store the part 312 of the parity 310 for the weak wordline WLw (e.g., parity bits that cannot be stored in the parity region of the weak wordline WLw) in the parity region of the strong wordline WLs paired with the weak wordline WLw.

In one or more embodiments, when the storage controller 200 reads data stored in the weak wordline WLw, if failing to correct an error in the data based on (e.g., using) the parity stored in the weak wordline WLw (i.e., the part 311 of the parity 310), the storage controller 200 may read the remaining part 312 of the parity 310 stored in the strong wordlines WLs paired with the weak wordline WLw, and further use the remaining part 312 to correct the error in the data. In one or more embodiments, the storage controller 200 may restore the part 311 of the parity 310 by correcting an error in the part 311 of the parity 310 based on (e.g., using) the remaining part 312 of the parity 310, and restore the data by correcting an error in the data based on (e.g., using) the restored part 311 of the parity 310. In one or more embodiments, the storage controller 200 may read the remaining part 312 of the parity 310 from the parity region of the strong wordline WLw if the error occurs in the part 311 of the parity 310, regardless of a read request from the host device 110.

In one or more embodiments, as shown in FIG. 4, an ECC engine 421 may be provided in a non-volatile memory device 420 of a storage device 400 which may be or correspond to the non-volatile memory device 122 of the storage device 120 shown in FIG. 1. In one or more embodiments, the ECC engine 421 may be formed as a chip (e.g., an ASIC) in the non-volatile memory device 420. Since the storage controller 410, the non-volatile memory device 420, and the ECC engine 421 operate the same or similarly to the storage controller 121 or 200, the non-volatile memory device 122, and the ECC engine 250 described with reference to FIGS. 1 to 3, their descriptions are omitted.

As described above, in one or more embodiments, because more parities are generated for the weak wordline, even if many errors occur in the data stored on the weak wordline, the errors in the data stored on the weak wordline can be corrected. Accordingly, in one or more embodiments, no separate defense code may be used to protect the weak wordline or a reclaim operation may be prevented, thereby preventing performance degradation of the storage device.

Figure 5:
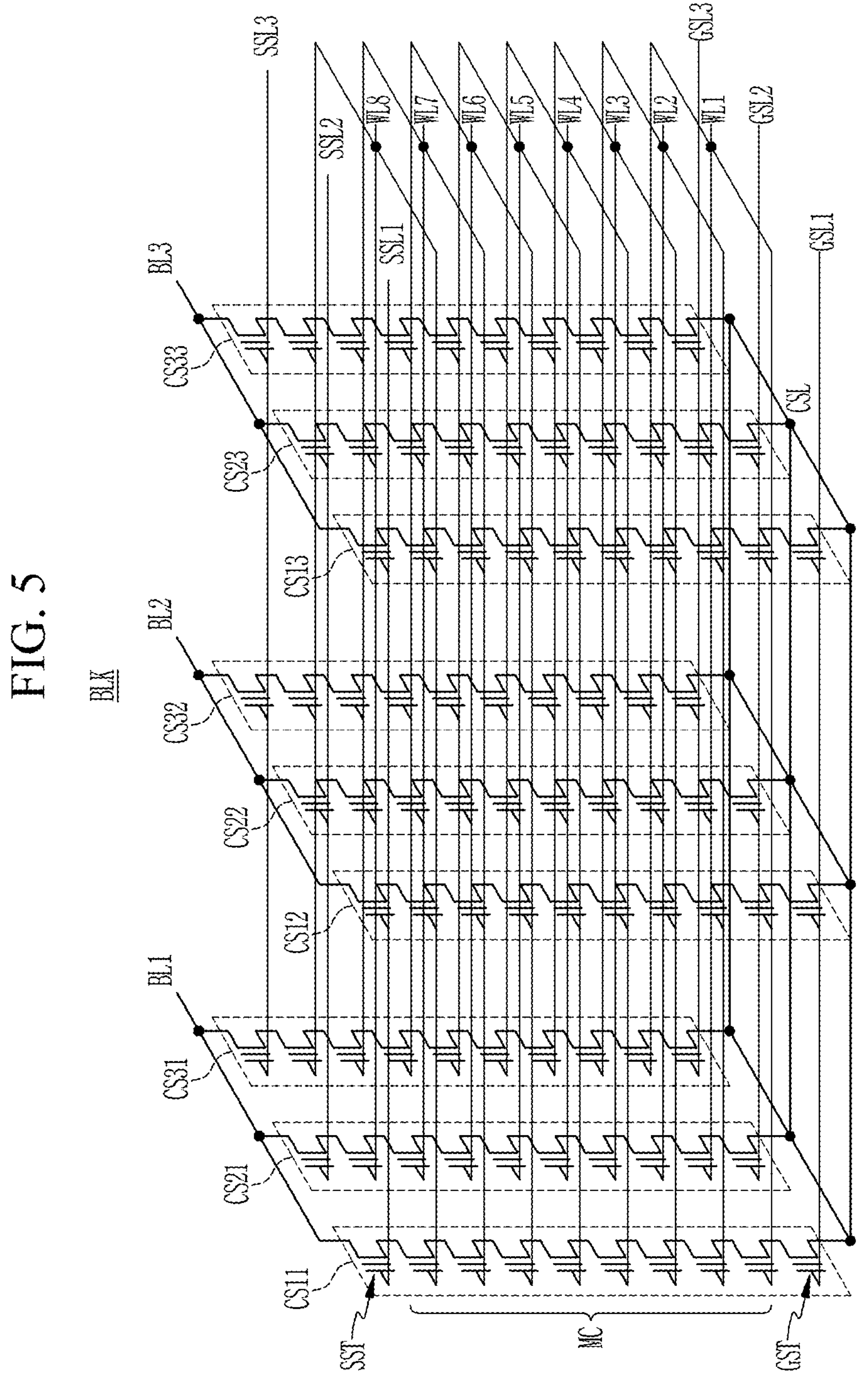
FIG. 5 is a circuit diagram illustrating an example of a memory cell array according to one or more embodiments.

FIG. 5 is a circuit diagram illustrating an example of a memory cell array according to one or more embodiments.

A memory cell array shown in FIG. 5 may be a memory cell array having a vertical structure, for example, a NAND flash memory cell array. The memory cell array shown in FIG. 5 may correspond to one of a plurality of blocks included in the memory cell array or a part of the block.

Referring to FIG. 5, a block BLK of the memory cell array may include a plurality of cell strings CS11, CS12, CS13, CS21, CS22, CS23, CS31, CS32, and CS33. Each cell string may include a string select transistor SST, a plurality of memory cells MC, and a ground select transistor GST connected in series. The transistors SST and GST, and memory cells MC included in each cell string may form a structure stacked in a direction perpendicular to a substrate.

The block BLK may include wordlines WL1, WL2, WL3, WL4, WL5, WL6, WL7, and WL8 extending in substantially a first direction and bitlines BL1, BL2, and BL3 extending in substantially a second direction intersecting the first direction. The bitline BL1 may be connected to the string select transistors SST (e.g., drains of the string select transistors SST) of the cell strings CS11, CS21, and CS31, the bitline BL2 may be connected to the string select transistors SST (e.g., drains of the string select transistor SST) of the cell strings CS12, CS22, and CS32, and the bitline BL3 may be connected to string select transistors SST (e.g., drains of the string select transistors SST) of the cell strings CS13, CS23, and CS33. The ground select transistors GST (e.g., sources of the ground select transistors GST) of the cell strings CS11 to CS33 may be connected to a common source line CSL.

The string select transistors SST (e.g., gates of the string select transistors SST) of the cell strings CS11, CS12, and CS13 may be connected to a string select line SSL1, the string select transistors SST (e.g., gates of the string select transistors SST) of the cell strings CS21, CS22, and CS23 may be connected to a string select line SSL2, and the string select transistors SSTs (e.g., gates of the string select transistors SSTs) of the cell strings CS31, CS32, and CS33 may be connected to a string select line SSL3. Further, the ground select transistors GST (e.g., gates of the ground select transistors GST) of the cell strings CS11, CS12, and CS13 may be connected to a ground select line GSL1, the ground select transistors GST (e.g., gates of the ground select transistors GST) of the cell strings CS21, CS22, and CS23 may be connected to a ground select line GSL2, and the ground select transistors GST (e.g., gates of the ground select transistors GST) of the cell strings CS31, CS32, and CS33 may be connected to a ground select line GSL3.

In each cell string, the memory cell MC of each layer may be connected to a wordline WLi of the corresponding layer, where i is an integer between 1 and 8.

In FIG. 5, the number of cell strings CS11 to CS33, the number of wordlines WL1 to WL8, the number of bitlines BL1 to BL3, the number of ground select lines GSL1 to GSL3, and the number of string select lines SSL1 to SSL3 are example values for convenience, and are not limited thereto.

When programming memory cells MC positioned at the same height or level in such a structure, a program voltage may be applied to the wordline WLi of corresponding memory cells MC and a pass voltage to the wordlines WLj of the other memory cells MC, where j is an integer between 1 and 8, excluding i.

Figure 6:
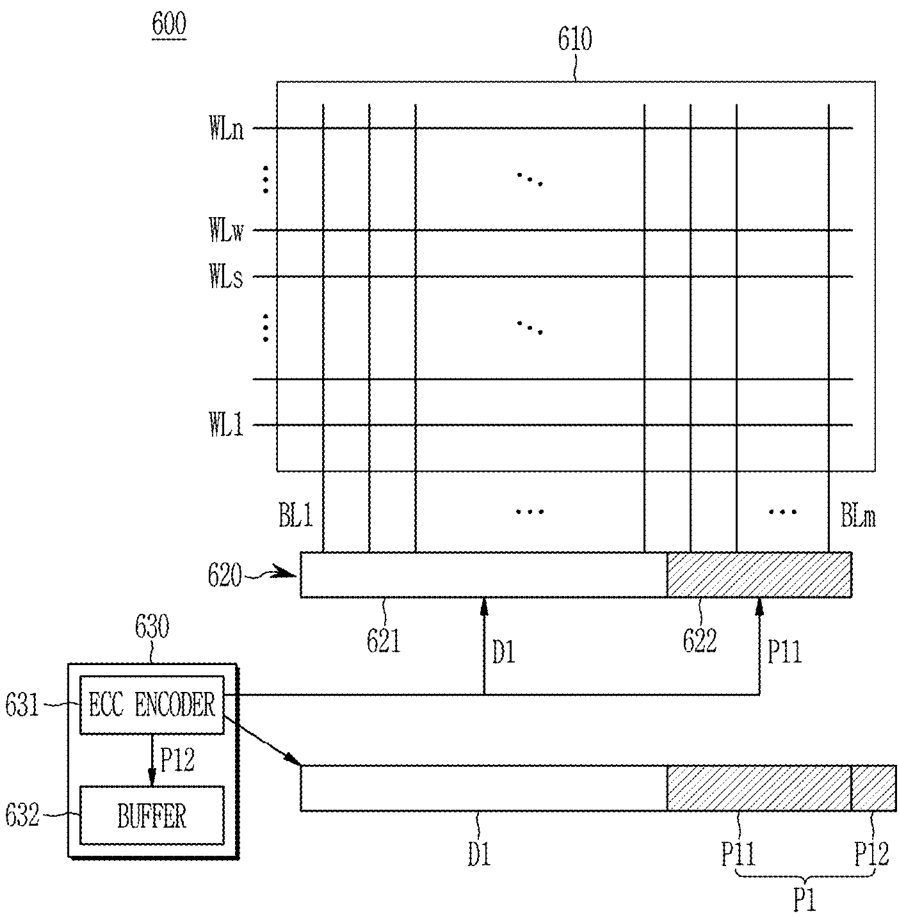
FIG. 6 and FIG. 7 each are drawings illustrating an example of a method of applying a dynamic parity in a storage device according to one or more embodiments.
Figure 7:
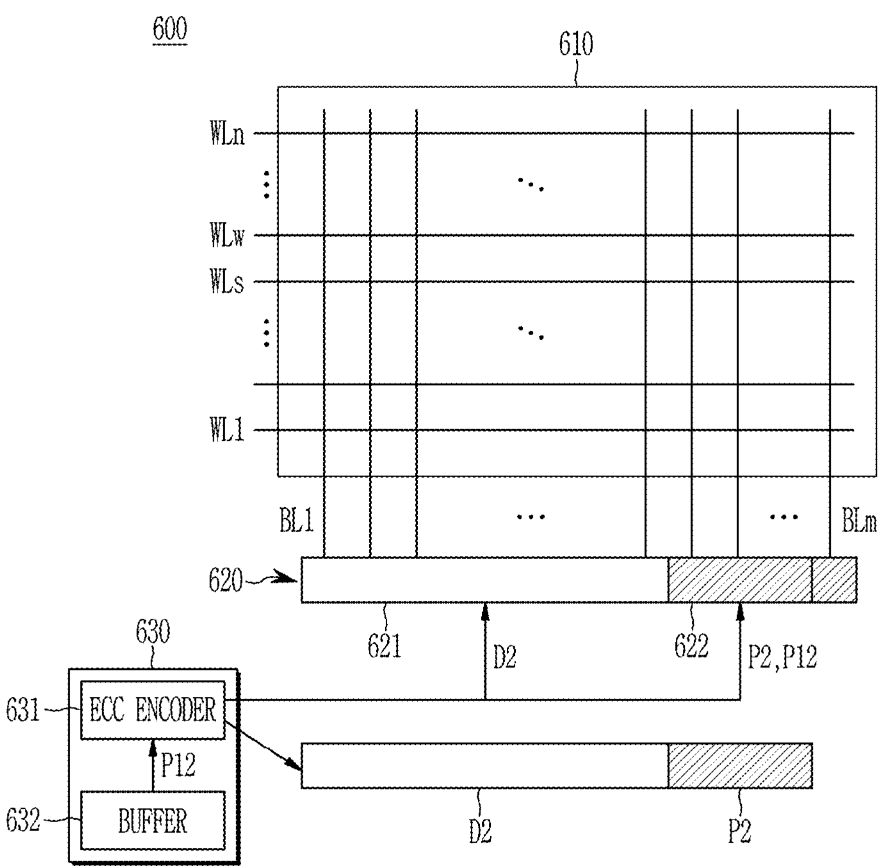
Figure 8:
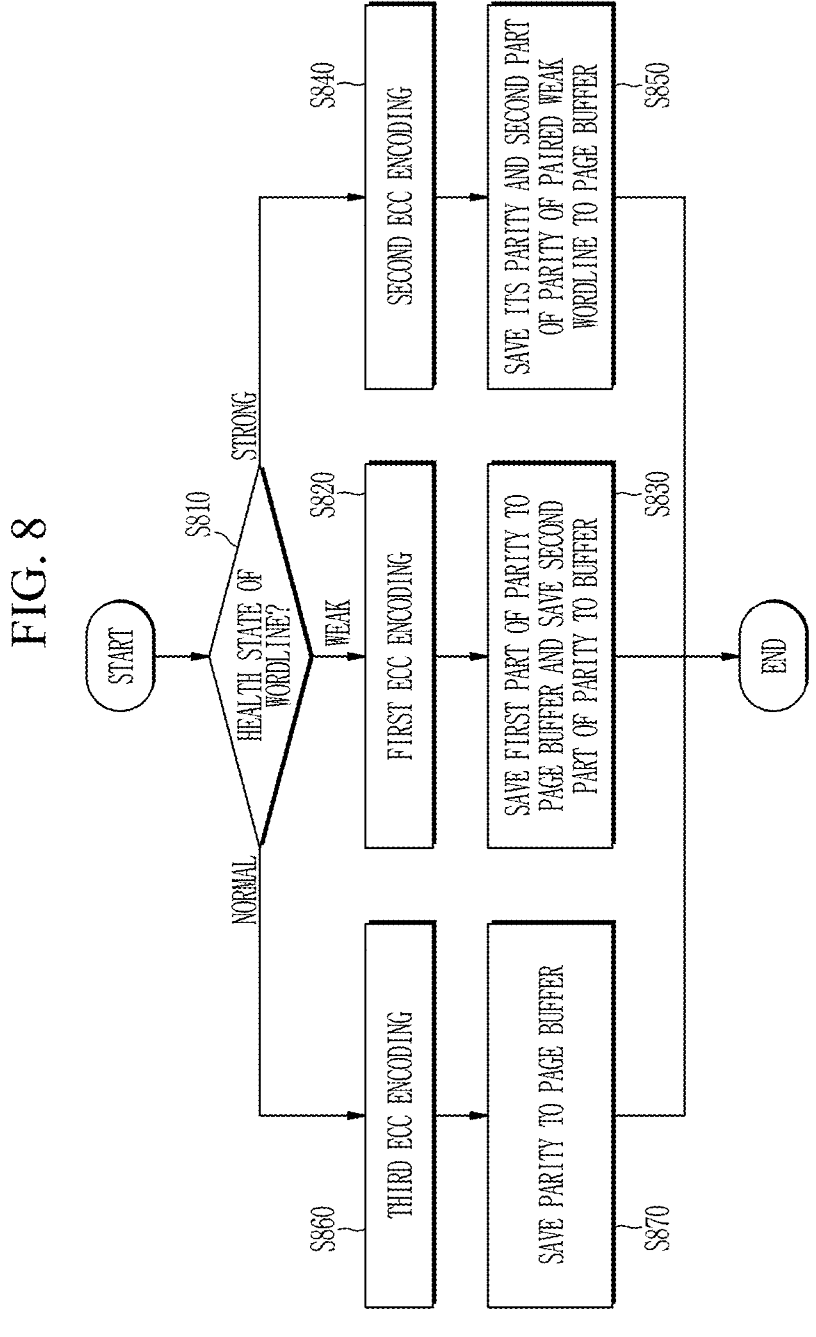
FIG. 8 is a flowchart illustrating an example of a method of applying a dynamic parity in a storage device according to one or more embodiments.

FIG. 6 and FIG. 7 each are drawings illustrating an example of a method of applying a dynamic parity in a storage device according to one or more embodiments, and FIG. 8 is a flowchart illustrating an example of a method of applying a dynamic parity in a storage device according to one or more embodiments.

Referring to FIG. 6, a storage device 600 may include a memory cell array 610, a page buffer 620, and an ECC engine 630.

The memory cell array 610 may include a plurality of wordlines WL1 to WLn extending in a first direction and a plurality of bitlines BL1 to BLm extending in a second direction intersecting the first direction. The memory cell array 610 may include a plurality of memory cells, and each memory cell may be connected to a corresponding wordline of the plurality of wordlines WL1 to WLn and a corresponding bitline of the plurality of bitlines BL1 to BLm.

The page buffer 620 may be connected to the bitlines BL1 to BLm of the memory cell array 610 and may temporarily store data to be programmed to a target wordline (e.g., a target page) among the plurality of wordlines WL1 to WLn. The page buffer 620 may include a space for storing data (data space) 621 and a space for storing a parity (parity space) 622.

The ECC engine 630 may include an ECC encoder 631 and a buffer 632. The ECC encoder 631 may perform ECC encoding on target data to generate a parity, and output encoded data including the target data and the parity. The buffer 632 of the ECC engine 630 may be a different structural element from the page buffer 620.

Referring to FIG. 6 and FIG. 8, in S810, the ECC encoder 631 may determine a health state of the target wordline (e.g., a wordline to which the target page belongs) to which the target data is to be programmed (or written). If the target wordline is a weak wordline WLw in S810, the ECC encoder 631 may perform ECC encoding (e.g., first ECC encoding) having a high parity generation rate on the target data to generate a parity P1 for the target data D1 in S820. As a parity generation rate increases, the number of parity bits in the generated parity may increase. A size (e.g., the number of parity bits) of the generated parity P1 may be greater than a size (e.g., the number of parity bits) of a parity generated by a typical (or default) ECC encoding (e.g., third ECC encoding) used by the storage device. In one or more embodiments, the ECC encoder 631 may perform the first ECC encoding by performing ECC encoding on the target data D1 to generate a part P11 of the parity P1 and performing ECC encoding on the part P11 of the parity P1 to generate a remaining part P12 of the parity P1.

In S830, the ECC encoder 631 may transfer the target data D1 and the part (e.g., a first part) P11 of the parity P1 to the page buffer 620, and store the remaining part (e.g., a second part) P12 of the parity P1 in the buffer 632. The target data D1 may be stored in the data space 621 of the page buffer 620, and the parity part P11 may be stored in the parity space 622 of the page buffer 620. The parity part P11 transferred to the page buffer 620 may be parity bits corresponding to a size of the parity space 622 of the page buffer 620 among the generated parity bits P1, and the parity part P12 stored in the buffer 632 may be parity bits excluding the parity bits P11 corresponding to the size of the parity space 622 of the page buffer 620 from the generated parity bits P1. The target data D1 and the parity part P11 stored in the page buffer 620 may be programmed to the corresponding wordline WLw.

Referring to FIG. 7 and FIG. 8, if the target wordline to which the target data is be programmed is a strong word WLs in S810, the ECC encoder 631 may perform ECC encoding (e.g., second ECC encoding) having a low parity generation rate on the target data to generate a parity P2 for the target data D2 in S840. A size (e.g., the number of parity bits) of the generated parity P2 may be smaller than a size (e.g., the number of parity bits) of parity generated by typical ECC encoding (e.g., the third ECC encoding).

In this case, the ECC encoder 631 may transfer the target data D2 and the parity P2 for the target data D2, as well as the part P12 of the parity P1 for the weak wordline WLw paired with the strong wordline WLs, to the page buffer 620 in S850. In one or more embodiments, since the strong wordline WLs may be programmed after programming of the weak wordline WLw, the weak wordline WLw paired with the strong wordline WLs may be the wordline WLw programmed immediately before the strong wordline WLs. In one or more embodiments, since the part P12 of the parity P1 for the weak wordline WLw is stored in the buffer 632, the ECC encoder 631 may transfer the parity part P12 stored in buffer 632 to the page buffer 620 in S850. The target data D2 may be stored in the data space 621 of the page buffer 620, and the parity P2 and the parity part P12 may be stored in the parity space 622 of the page buffer 620. In one or more embodiments, the second ECC encoding may allow the number of parity bits generated by the second ECC encoding to be smaller than or equal to the number of parity bits generated by the first ECC encoding minus the size of the parity space 622 (e.g., the parity region in the wordline). Accordingly, the parity space 622 may store both the parity P2 generated by the second ECC encoding and the part P12 of the parity P1 generated by the first ECC encoding. The target data D2, the parity P2, and the parity part P12 stored in the page buffer 620 may be programmed to the corresponding wordline WLs.

If the target wordline to which the target data is to be programmed is neither the weak wordline WLw nor the strong wordline WLs (i.e., is a normal wordline) in S810, the ECC encoder 631 may perform the typical ECC encoding (e.g., the third ECC encoding) on the target data to generate a parity for the target data in S860. The third ECC encoding may have a lower parity generation rate than the first ECC encoding and a higher parity generation rate than the second ECC encoding. The ECC encoder 631 may transfer the target data and the parity to the page buffer 620 in S870. The target data may be stored in the data space 621 of the page buffer 620, and the parity may be stored in the parity space 622 of the page buffer 620. The target data and the parity stored in the page buffer 620 may be programmed to the corresponding wordline.

As described above, in one or more embodiments, because more parities are generated in the weak wordline, even if many errors occur in the data stored on the weak wordline, the errors in the data stored on the weak wordline can be corrected.

Figure 9:
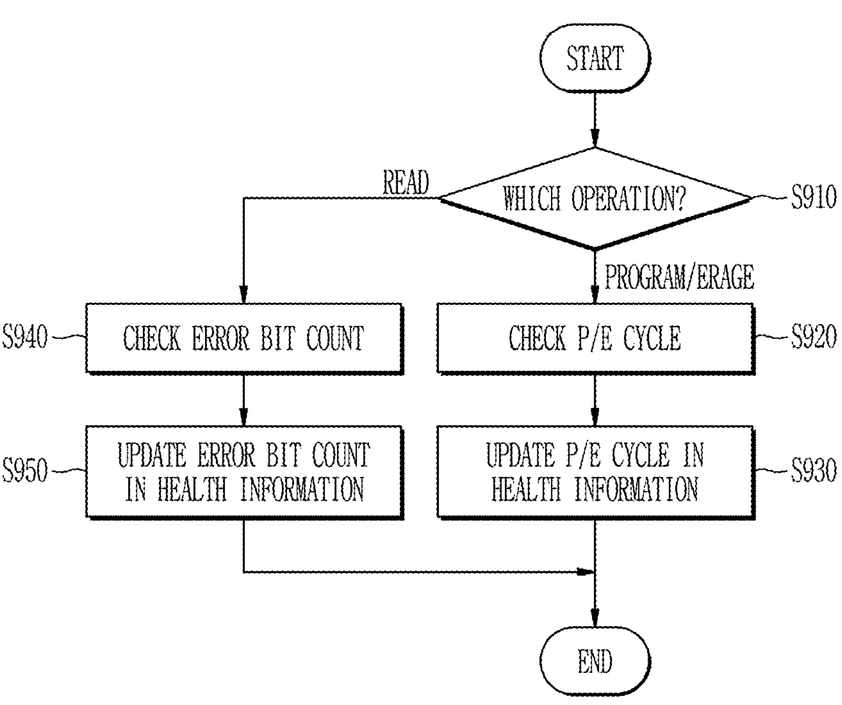
FIG. 9 is a flowchart illustrating an example of a memory health check method in a storage device according to one or more embodiments.
Figure 10:
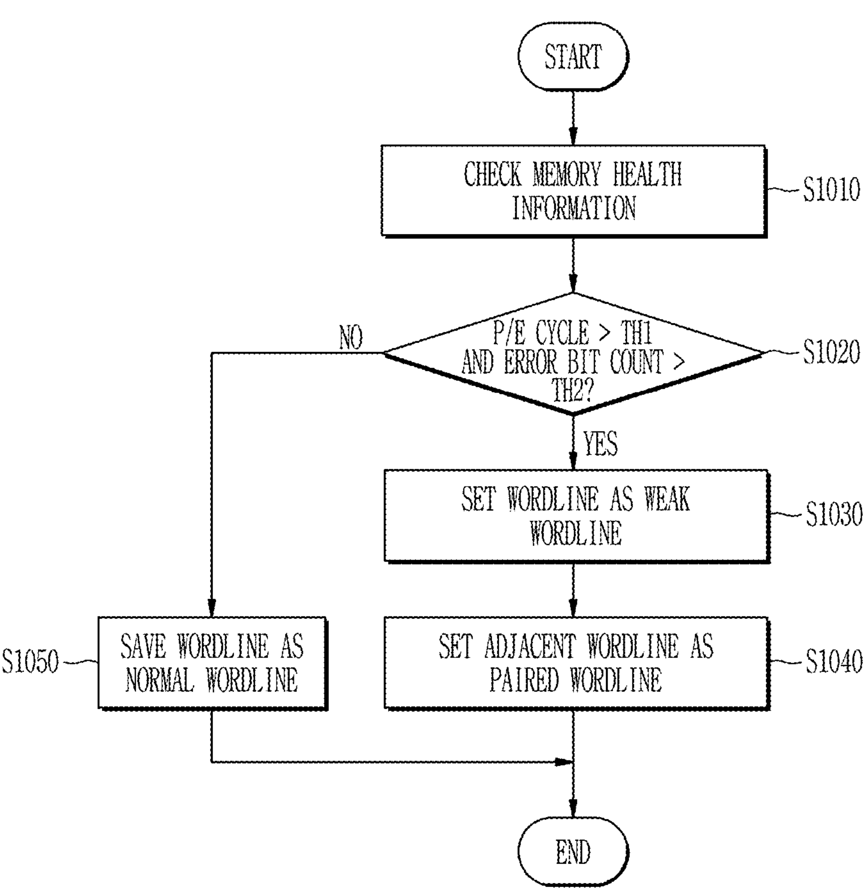
FIG. 10 is a flowchart illustrating an example of a weak wordline identification method in a storage device according to one or more embodiments.

FIG. 9 is a flowchart illustrating an example of a memory health check method in a storage device according to one or more embodiments, and FIG. 10 is a flowchart illustrating an example of a weak wordline identification method in a storage device according to one or more embodiments.

Referring to FIG. 9, a memory health check logic may determine whether a current operation is a program or erase operation or a read operation in S910. If the operation is the program or erase operation, the memory health check logic may determine a P/E cycle count (i.e., the number of P/E cycles) for each wordline (e.g., a page of each wordline) in S920. The memory health check logic may update the P/E cycle count for each wordline stored in memory health information with the determined P/E cycle count in S930. In one or more embodiments, a plurality of wordlines included in the same block may have the same P/E cycle count. In one or more embodiments, the memory health check logic may manage the P/E cycle count for each wordline based on a row address of that wordline.

In the read operation, the memory health check logic may determine an error bit count (i.e., the number of error bits) for each wordline (e.g., a page of each wordline) in S940. The memory health check logic may update the error bit count for each wordline stored in the memory health information with the determined error bit count in S950. The error bit count may indicate the number of error bits that occurs when reading data from each wordline. In one or more embodiments, the memory health check logic may manage the error bit count for each wordline based on the row address of that wordline.

In one or more embodiments, the memory health check logic may store the memory health information in the form of a map. For example, the memory health check logic may store the P/E cycle count and the error bit count per wordline (or per row address of the wordline) in the form of a map.

Referring to FIG. 10, a memory health check logic may check memory health information about each wordline in S1010. The memory health check logic may determine whether the memory health information about a certain wordline satisfies a predetermined condition in S1020. In one or more embodiments, the predetermined condition may be based on a data retention ability of a wordline (i.e., memory cells of the wordline). In one or more embodiments, the predetermined condition may be a condition in which the P/E cycle count exceeds a threshold (e.g., a first threshold) TH1 and the error bit count exceeds a threshold (e.g., a second threshold) TH2. In one or more embodiments, if any one of the P/E cycle count and the error bit count is significant to degradation of the memory cells, the predetermined condition may include a corresponding one of a condition in which the P/E cycle count exceeds the threshold value TH1 and a condition in which the error bit count exceeds the threshold TH2. In one or more embodiments, the thresholds TH1 and TH2 may be set during an initialization process of firmware. In one or more embodiments, the thresholds TH1 and TH2 may be set depending on a model of a non-volatile memory device. In one or more embodiments, the thresholds TH1 and TH2 may be adjusted by settings on a storage device.

If the memory health information about the certain wordline satisfies the predetermined condition (S1020: yes), the memory health check logic may set the certain wordline as a weak wordline in S1030. In one or more embodiments, if the P/E cycle count of the certain wordline exceeds the threshold TH1 and the error bit count of the certain wordline exceeds the threshold TH2, the memory health check logic may set the certain wordline as the weak wordline in S1030.

The memory health check logic may set a wordline having a predetermined relationship with the weak wordline as a wordline (or strong wordline) paired with that weak wordline in S1040. In one or more embodiments, the wordline having the predetermined relationship may be a wordline that is adjacent to the weak wordline. In one or more embodiments, the wordline having the predetermined relationship may be a next programming wordline of the weak wordline (e.g., a wordline that is programmed after the weak wordline).

The memory health check logic may set wordlines that are neither the weak wordline nor the wordline (strong wordline) paired with the weak wordline as normal wordlines in S1050.

In one or more embodiments, the memory health check logic may manage the weak, strong, and normal wordlines as a health state of each wordline. For example, the health state of each wordline may have one of the following values: a value indicating the normal wordline (e.g., 0), a value indicating the weak wordline (e.g., 1), and a value indicating the strong wordline (e.g., 2).

As described above, the memory health check logic may check the memory health state of each wordline and may manage the weak wordline and the wordline paired with the weak wordline.

While this disclosure has been described in connection with what is presently considered to be practical embodiments, it is to be understood that the disclosure is not limited to the above-described embodiments. On the contrary, it is intended to cover various modifications and equivalent arrangements included within the spirit and scope of the appended claims.

What is claimed is:

1. A storage device comprising:

a memory cell array comprising a plurality of wordlines;

an error correction code (ECC) engine configured to identify a first wordline among the plurality of wordlines based on a count associated with the first wordline exceeding a threshold, perform first ECC encoding on first data to be programmed to the first wordline to generate a first parity, and perform second ECC encoding on second data to be programmed to a second wordline among the plurality of wordlines to generate a second parity; and a page buffer configured to store the first data and a first part of the first parity to be programmed to the first wordline, and store the second data, a second part of the first parity, and the second parity to be programmed to the second wordline.

2. The storage device of claim 1, wherein a size of the first parity generated by the first ECC encoding is greater than a size of the second parity generated by the second ECC encoding.

3. The storage device of claim 2, wherein the ECC engine is further configured to perform third ECC encoding on third data to be programmed to a third wordline among the plurality of wordlines to generate a third parity, and wherein the size of the first parity generated by the first ECC encoding is greater than a size of the third parity generated by the third ECC encoding, and the size of the second parity generated by the second ECC encoding is smaller than the size of the third parity generated by the third ECC encoding.

4. The storage device of claim 1, wherein the ECC engine comprises a buffer configured to temporarily store the second part of the first parity before storing the second part of the first parity to the page buffer.

5. The storage device of claim 1, wherein the second wordline is a wordline paired with the first wordline.

6. The storage device of claim 1, wherein the first wordline is a wordline satisfying a predetermined condition among the plurality of wordlines, and wherein the second wordline is a wordline having a predetermined relationship with the first wordline among the plurality of wordlines above.

7. The storage device of claim 6, wherein the predetermined condition is a condition determined based on a data retention ability.

8. The storage device of claim 6, wherein the predetermined condition comprises a condition in which an error bit count exceeds the threshold.

9. The storage device of claim 6, wherein the predetermined condition comprises a condition in which a program/erase cycle count exceeds the threshold.

10. The storage device of claim 6, wherein the predetermined condition comprises a condition in which a program/erase cycle count exceeds a first threshold and an error bit count exceeds a second threshold.

11. The storage device of claim 6, wherein the wordline having the predetermined relationship with the first wordline is a wordline adjacent to the first wordline.

12. The storage device of claim 6, wherein the wordline having the predetermined relationship with the first wordline is a wordline to be programmed after the first wordline.

13. The storage device of claim 1, wherein the ECC engine is further configured to perform the first ECC encoding by performing a third ECC encoding on the first data to generate the first part of the first parity, and performing a fourth ECC encoding on the first part of the first parity to generate the second part of the first parity.

14. A storage device comprising:

a non-volatile memory device comprising a memory cell array comprising a plurality of wordlines; and an error correction code (ECC) engine configured to identify a first wordline among the plurality of wordlines based on a count associated with the first wordline exceeding a threshold, perform first ECC encoding on first data to be programmed to the first wordline to generate a first parity, and perform second ECC encoding on second data to be programmed to a second wordline paired with the first wordline among the plurality of wordlines to generate a second parity, the second ECC encoding having a lower parity generation rate than the first ECC encoding.

15. The storage device of claim 14, wherein the ECC engine is further configured to:

transfer the first data and a first part of the first parity to the non-volatile memory device such that the first data and the first part of the first parity are programmed to the first wordline; and transfer the second data, the second parity, and a second part of the first parity to the non-volatile memory device such that the second data, the second parity, and the second part of the first parity are programmed to the second wordline.

16. The storage device of claim 15, wherein the ECC engine comprises a buffer configured to store the second part of the first parity.

17. The storage device of claim 14, wherein the ECC engine is further configured to perform third ECC encoding on third data to be programmed to a third wordline among the plurality of wordlines to generate a third parity, and wherein the third ECC encoding has a lower parity generation rate than the first ECC encoding and a higher parity generation rate than the second ECC encoding.

18. The storage device of claim 14, wherein the first wordline satisfies at least one of a condition in which a program/erase cycle count exceeds a first threshold and a condition in which an error bit count exceeds a second threshold.

19. The storage device of claim 14, wherein the second wordline is a wordline to be programmed after the first wordline.

20. A method of applying dynamic parity in a storage device, the method comprising:

identifying a first wordline among a plurality of wordlines based on a count associated with the first wordline exceeding a threshold;

performing first error correction code (ECC) encoding on first data to generate a first parity;

programming the first data and a first part of the first parity into the first wordline;

performing second ECC encoding on second data to generate a second parity, the second ECC encoding having a lower parity generation rate than the first ECC encoding; and programming the second data, the second parity, and a second part of the first parity to a second wordline paired with the first wordline.

* * * * *